Oct. 25, 1966 M. G. REIFFIN 3,281,535

TRANSISTOR POWER AMPLIFIERS

Filed April 2, 1963 4 Sheets-Sheet 1

INVENTOR.

Martin G. Reiffin

INVENTOR.

Martin G. Reiffin

Oct. 25, 1966 M. G. REIFFIN 3,281,535

TRANSISTOR POWER AMPLIFIERS

Filed April 2, 1963 4 Sheets-Sheet 3

INVENTOR.

Martin G. Reiffin

INVENTOR.
Martin G. Reiffin

United States Patent Office 3,281,535 Patented Oct. 25, 1966

3,281,535

TRANSISTOR POWER AMPLIFIERS

Martin G. Reiffin, New York, N.Y.
(102 Gallows Hill Road, Peekskill, N.Y.)

Filed Apr. 2, 1963, Ser. No. 270,011
29 Claims. (Cl. 179—1)

This invention relates generally to transistor power amplifiers, and more particularly to such amplifiers of the type having high power output and low distortion so as to be suitable or high fidelity music reproduction.

In the prior art the most widely known transistor power amplifier circuit comprises a first stage of voltage amplification in the form of a grounded-emitter transistor having its collector output direct-coupled to the respective bases of a push-pull pair of complementary transistors constituting the second or drive stage. The latter is in turn direct-coupled to a third or output stage comprising a pair of power transistors in a push-pull single-ended half-bridge connection. The output stage is generally capacitor-coupled to the speaker so as to eliminate the output transformer with its attendant high cost, large distortion and instability-producing phase shift.

Although this prior circuit is superior to others in most respects and offers the advantages of transformer less operation, low distortion, minimal phase shift, feedback stability and thermal stability, it has one defect which has heretofore deprived it of any significant utility in high fidelity applications. That is, this prior circuit as heretofore constructed does not have sufficient power output for a given transistor cost to enable it to compete successfully with vacuum tube amplifiers or other transistor circuits. This deficiency of power output has been particularly fatal to the acceptance of said circuit in more recent times in view of the present trend toward low efficiency speakers requiring must greater power than was generally considered necessary heretofore.

The limited power output of this prior circuit is due to its inserent structure which causes the entire quiescent voltage plus the signal output voltage to be impressed across the collector-emitter terminals of every transistor from the first stage common-emitter voltage amplifier to the third stage output transistors. Therefore the output swing is limited to the amplitude at which the transistor having the lowest collector-emitter breakdown voltage exceeds its breakdown limit and starts "clipping."

When utilizing transistors of feasible cost this clipping usually occurs in one of the first two stages long before the power dissipation limit of the output transistors is approached, and the result is a power output far below the inherent capabilities of the output stage. One prior attempted solution of the problem has been to employ in the circuit only transistors having extraordinarily high breakdown voltage ratings, and the result has been an amplifier with extremely high quality and a fair amount of power output, but the exhorbitant cost of such transistors rendered the market price of the amplifier several times the price of competitive amplifiers in its power class. The general response of the art has been to abandon this circuit in favor of other transistor circuits having lower quality but greater power capabilities, and usually requiring output transformers, driver transformers, or capacitor coupling between stages.

It is therefore a primary object of the present invention to provide a transistor power amplifier having the advantages of said prior circuit but without the power limitations thereof. In the circuit of the present invention the power output is limited only by the number of transistors which the designer is willing to utilize, and the transistors may be of the most inexpensive types.

This is achieved by providing that both the quiescent voltage and the signal swing voltage be divided between a plurality of transistors so that no single transistor will be subjected to the entire voltage. This permits a larger output signal voltage before clipping occurs. Since the power output is proportional to the square of the output signal voltage, it will be seen that if the latter is merely doubled the power output will be four times as large.

The voltage-sharing effect is obtained in the present invention by arranging the transistors in series-connected pairs (or larger pluralities) extending across the total output voltage so that each individual transistor is subjected to only its proportionate share of the total voltage. Of course the broad concept of series elements to provide voltage division has been utilized in the electrical arts since their inception, and the series connection of transistors for this purpose is old and known in the art. However the present invention incorporates this old expedient to form a novel combination of a series-connected plural-transistor stage (or stages) with other stages which drive and are driven by the series-connected stage (or stages) in a novel manner so as to provide a new multi-stage amplifier having all of the advantageous features of said prior circuit together with high power output limited only by the number of transistors utilized.

It should be noted that the mere addition of extra paralleled transistors to a transformerless amplifier does not raise its power output capability. Instead, the current divides among the extra transistors and the total power output remains substantially the same because the composite load-line is determined by the speaker and remains fixed in the absence of a transformer. Furthermore, the mere addition of extra series transistors to an amplifier is generally not feasible because, unlike the parallel case, there is usually no suitable drive for the added transistors which are likely to provide only added difficulties.

The present invention provides other advantages in addition to the elimination of premature collector-emitter voltage breakdown. The power limitations heretofore seriously affecting all three stages can now be obviated. For example, the first stage, operating Class A, must have a minimum collector load resistor for a given allowable quiescent collector current in order to provide the required quiescent collector voltage. As will be explained in detail below, the smaller this resistor the larger may be the maximum output signal amplitude of the amplifier. By dividing the voltage and power between two or more transistors, the quiescent collector current of the first stage may be increased without exceeding the power dissipation limits of the individual transistors, and thereby permit a smaller collector load resistor so as to result in a larger maximum output signal and increased power output for the amplifier as a whole.

Other objects and advantages of the present invention are inherent in the circuits disclosed or will become apparent to those skilled in the art as the detailed description proceeds in connection with the accompanying drawings wherein.

Figure 3:
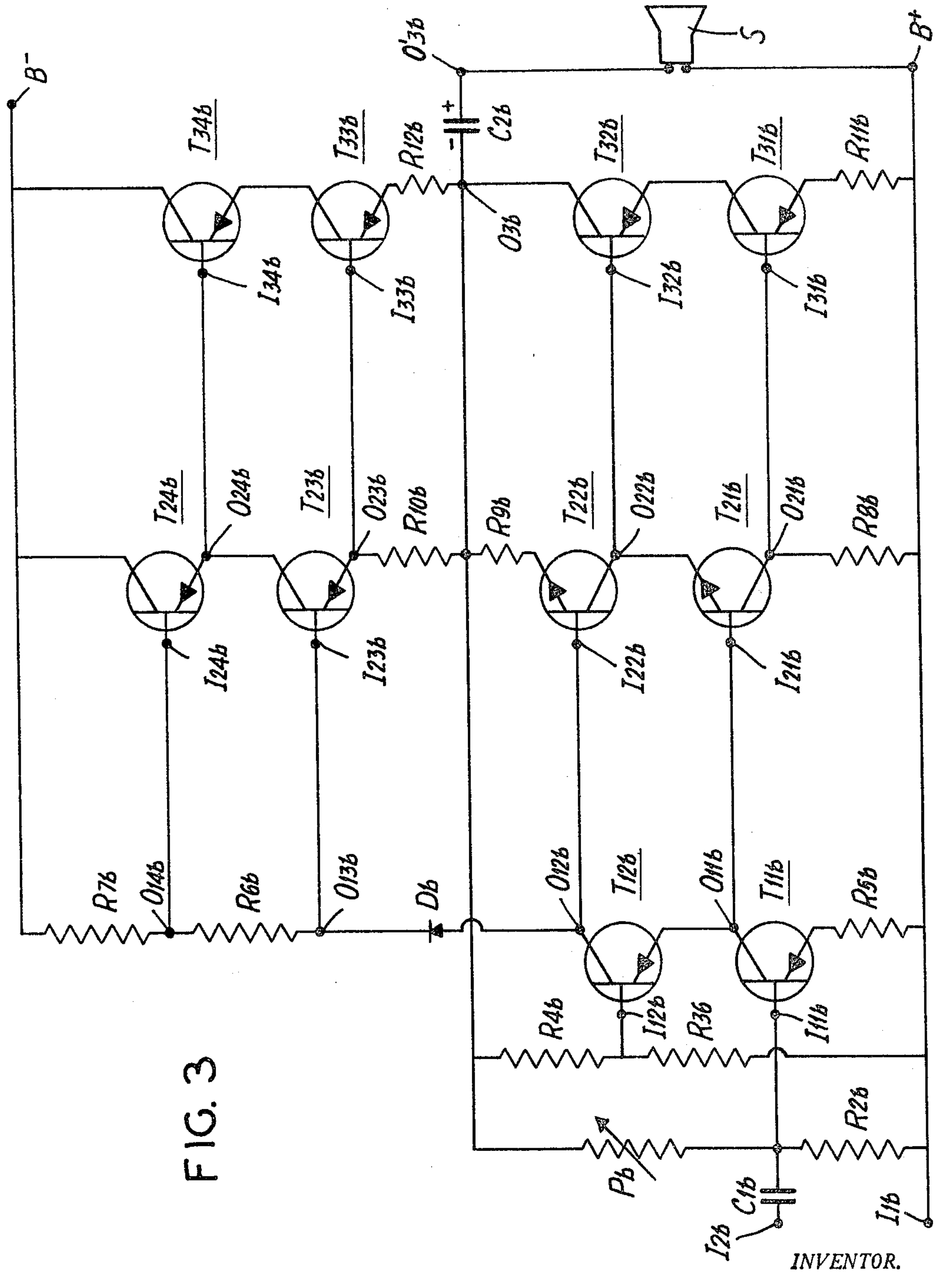
Figure 5:
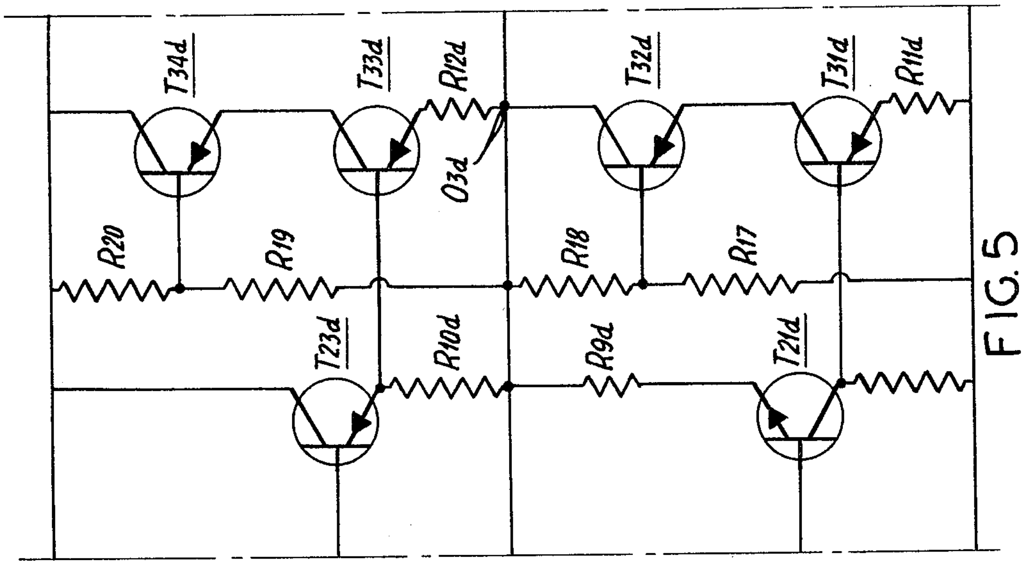
Figure 4:
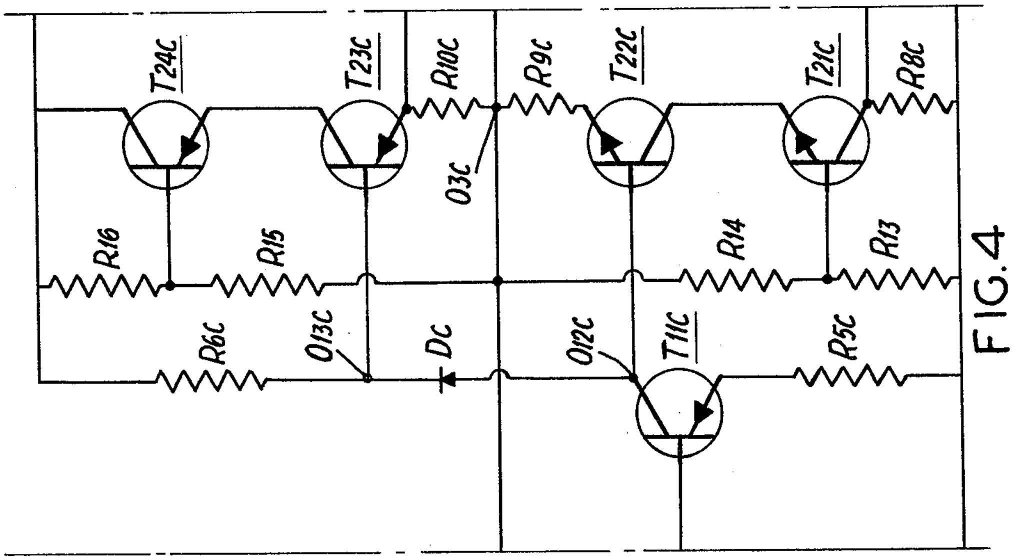

FIG. 3 discloses an embodiment of the invention wherein voltage-sharing is provided in the third or power output stage as well as in the preceding voltage-amplification and drive stages;

FIG. 4 shows only the first and second stages of a modified form of the invention; and FIG. 5 shows only the second and third stages of still another modified form of the invention.

Figure 2:
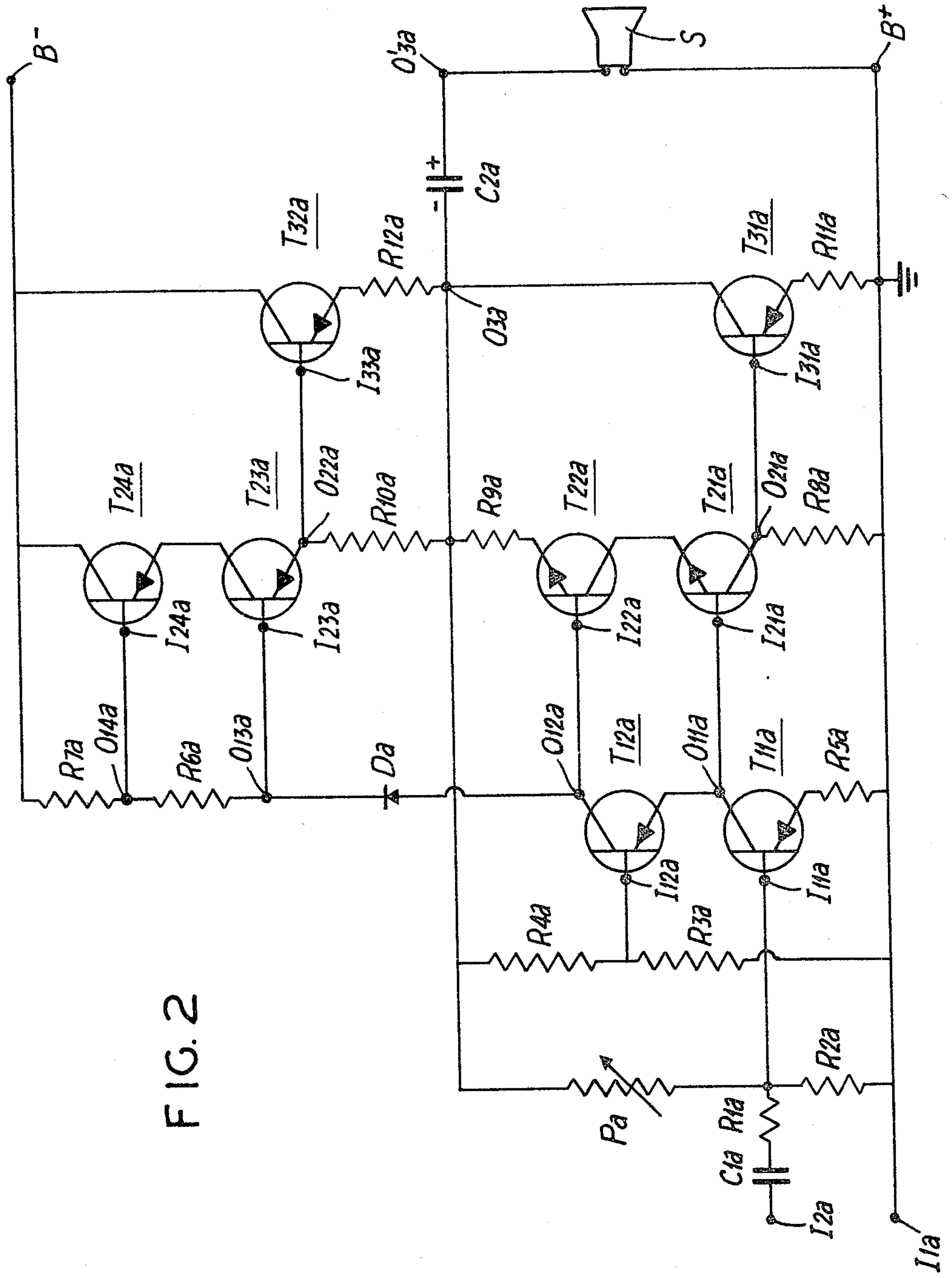
FIG. 2 shows another form of the invention wherein voltage-sharing is provided in both the first stage and the second or drive stage.

Referring now to the drawings in more detail, the reference designations for the various circuit elements are as follows: each transistor is prefixed by the capital letter "T" followed by a first numeral indicating the stage and then a second numeral indicating its position from ground in that stage. All elements of the embodiment of FIG. 2 are suffixed by the small letter "*a*"; those of FIG. 3 by the small letter "*b*"; those of FIG. 4 by the small letter "*c*"; and those of FIG. 5 by the small letter "*d*"; except where the elements do not have corresponding equivalents in the various embodiments. Each resistor designation is prefixed by the capital letter "R"; each capacitor by capital "C"; each potentiometer by capital "P"; each stage input terminal by capital "I"; and each stage output terminal by capital "O"; the input and output terminal designations also including numerals designating the respective stages and relative positions in each stage, as will be obvious.

Figure 1:
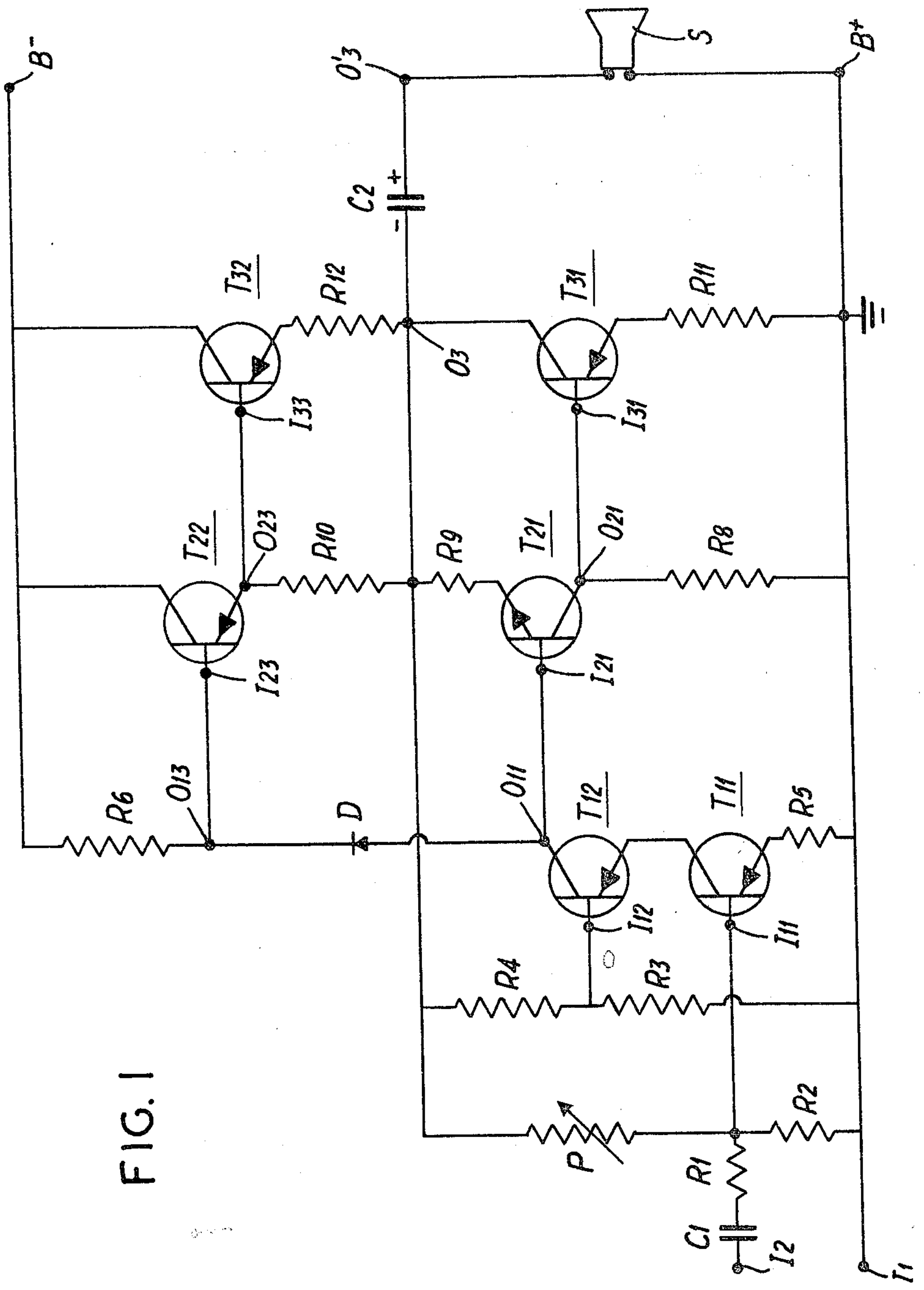
FIG. 1 shows a transistor power amplifier in accordance with the present invention and wherein voltage-sharing is provided only in the first voltage-amplification stage.

Describing first the embodiment of FIG. 1 wherein only the first stage has its transistors arranged to share the quiescent voltage and output swing, said first stage comprises transistors T11 and T12. The emitter of the latter is directly connected to the collector of the former so that the two transistors T11, T12 are in effect series-connected. The emitter of the first or lower transistor T11 is connected to ground through bias resistor R5. The collector of upper transistor T12 is connected to a resistance element which is preferably, but not necessarily, in the form of a diode D so as to provide temperature compensation, as is well-known in the art. The opposite end of diode D is connected to a resistor R6 which is in turn connected to the negative direct current supply terminal indicated by the reference letter $B^-$.

Bias for the base of lower transistor T11 is provided by a voltage divider consisting of a potentiometer P and resistor R2. The upper end of potentiometer P is connected to the output O3 which during the quiescent state is maintained at a potential approximately midway between that of the two terminals $B^-$ and $B^+$ of a conventional direct current power supply. This bias arrangement also provides the additional benefit of negative feedback and the resistor R1 is provided to prevent the feedback current from flowing into the preceding stage in the event that such stage has too low an output impedance. A coupling capacitor C1 is connected between resistor R1 and the input terminal I2. The other input terminal I1 is at ground potential.

It will thus be seen that the base of lower transistor T11 may be connected to an input signal source from a preceding stage (not shown) of the power amplifier or from the last stage of a preamplifier. Generally one or two stages of voltage and/or impedance transformation may be included ahead of what is designated herein as the "first" stage, but these preliminary stages present no difficulties, are not relevant to the present invention and therefore are omitted for simplification of the present disclosure. Therefore the base of transistor T11 may be regarded as one of the inputs of the first stage, said input being designated by the reference I11.

In order to drive the upper transistor T12 there is provided a votagle divider consisting of the series-connected resistors R3, R4. The upper end of resistor R4 is connected to the output O3 and the lower end of resistor R3 is connected to ground. The intermediate point of the voltage divider at the junction of resistors R3, R4 is connected to the base of upper transistor T12 and this base may be regarded as the other input I12 of the first stage.

The two outputs of the first stage are at the junction of diode D with the collector of upper transistor T12, designated at O11, and the junction of diode D with the lower end of resistor R6, designated at O13. It is important to note that the upper end of resistor R4 is preferably not connected to the output O11 of the first stage, but is instead connected to the output O3 of the third stage. Although the voltage of output O11 of the first stage is always approximately equal to the voltage of output O3 of the third stage, connection of the upper end of resistor R4 to the latter rather than to the former provides greatly improved results for reasons explained below.

The first stage is operated in the common-emitter connection and provides voltage amplification as well as current amplification. The respective signals at the inputs I11, I12 causes corresponding collector current variations in transistors T11, T12 and the resulting current variation through load resistor R6 causes voltage swing of outputs O11, O13 to thereby drive the second stage.

The latter comprises a pair of complementary transistors T21, T22. The first or lower transistor T21 is of NPN type and the second or upper transistor T22 is of PNP type. Of course, if the type of transistors in the first stage is NPN, instead PNP as disclosed, then the types in the succeeding stages will be correspondingly changed. It will be understood that all transistors in all embodiments may be reversed as to type.

The two respective bases of transistors T21, T22 constitute the two inputs of the second stage and are designated at I21, I23 respectively. The collector of lower transistor T21 is connected to the upper end of resistor R8 which has its lower end connected to ground. The emitter of lower transistor T12 is connected to a bias resistor R9 which is in turn connected to output O3 of the third stage. Also connected to output O3 is the lower end of a resistor R10 having its upper end connected to the emitter of the upper transistor T22.

The collector of the latter is connected to the negative supply terminal $B^-$. The second stage has two outputs, namely, output O21 at the collector of lower transistor T21 and output O23 at the emitter of upper transistor T22. The two inputs I21, I23 of the second stage are preferably directly coupled to the respective outputs O11, O13 of the first stage.

It will thus be seen that the second stage is operated push-pull. The bias voltage of the bases of second stage transistors T21, T22 is provided by the voltage drop across the resistance element in the form of diode D, in the conventional manner. Since second stage transistors T21, T22 are complementary types, they provide phase reversal to drive the succeeding third stage which is also operated push-pull.

The third stage comprises a pair of power transistors T31, T32. The emitter of lower transistor T31 is connected to ground through bias resistor R11 and the emitter of upper transistor T32 is connected to the third stage output O3 through bias resistor R12. The collector of lower transistor T21 is connected to output O3 and the collector of upper transistor T32 is connected to the negative supply terminal $B^-$. The two inputs of the third stage are located at the respective bases of transistors T31, T32 and are designated by I31 and I33 respectively. These inputs are preferably directly coupled to the respective outputs O21, O23 of the second stage.

The common-emitter first stage is operated Class A whereas the second and third push-pull stages are preferably operated Class AB with a quiescent operating point very close to the Class B position so as to provide a small quiescent collector current to minimize crossover distortion. The second stage operates in the emitter-follower connection so as to provide current gain with low distortion, as well as the phase reversal required to drive the output stage in push-pull operation.

The output stage is of the single-ended half-bridge type. Although the terminal O3 has been designated as the third stage output, it may be desired to isolate the load, such as a loudspeaker, from the D.C. potential of output terminal O3. For this purpose there is provided an electrolytic capacitor C2 having its negative terminal connected to output O3 and its positive terminal connected to a D.C.-isolated output terminal designated at O'3. A loudspeaker S may then have its voice coil terminals connected to output O'3 and ground, respectively.

When a signal source (not shown) applies an input signal to input terminal I2 and hence to the input I11 at the base of lower transistor T11 of the first stage, current through said transistor is thereby varied in accordance with the input signal so as to swing the first stage outputs I11, O13 and thereby drive the second stage which in turn drives the third or power output stage so as to cause output terminal O3 to swing accordingly. The voltage of output O3 will always be between that of outputs O11, O13 of the first stage so as to provide emitter-follower operation of the second and third stages with its attendant advantages of low distortion, improved frequency response and low output impedance.

If the voltage divider resistors R3, R4 are approximately equal, it will be seen that the voltage of first stage input I12 at the base of transistor T12 will always be maintained approximately midway between the voltage of third stage output O3 and ground. Since the voltage of the base of upper transistor T12 is approximately the same as the voltage of the collector of lower transistor T11, the collector-emitter voltages of the two transistors T11, T12 of the first stage remain approximately equal so that these transistors share between them both the quiescent voltage and the signal swing voltage.

Although the broad concept of providing series-connected transistors so as to divide the total voltage among the individual transistors has been known to the art heretofore, insofar as is known this expedient has not been successfully utilized in a multi-stage power amplifier. Furthermore, the prior utilization of this expedient has been somewhat ineffective in that the drive for the extra transistor is generally taken from the output of the single stage involved rather than from the output of a succeeding power stage. This prior art approach, although possibly somewhat operative in some design situations, is disadvantageous in that if the voltage divider resistors are small enough to provide adeqaute base current to drive the extra transistor then they tend to excessively load down the output of the stage. This is because, in so far as the A.C. equivalent circuit is concerned, the voltage divider resistors, if so connected, are in parallel with the load resistor. Thus the total effective load resistance of the stage is considerably reduced to the point where the effective load-line is extremely steep so as to limit the maximum voltage amplitude swing of the stage involved. The result may be that the maximum swing is either not significantly greater than, or even less than, the maximum swing that would be obtainable with the utilization of a single transistor in the stage, thereby defeating the very purpose of the entire arrangement. Furthermore, the reduced effective load resistance has the added disadvantage of substantially increased distortion.

Therefore, the operation of the plural-transistor series-connected first stage is considerably improved by providing in combination therewith a succeeding power stage having an output terminal with a relatively low source impedance, so that the voltage divider may be connected to this power output terminal to drive the extra transistor of the first stage without loading down the output of the first stage. More specifically, the upper end of resistor R4 is preferably connected to output O3 of the third stage rather than to outputs O11 or O13 of the first stage.

Of course, other points in the circuit having substantially the same voltage as output O3 and having a relatively low source impedance may also be employed as equivalent thereto. For example, the emitter of upper power transistor T32 has approximately the same voltage as output terminal O3 and has sufficiently low impedance so as to be relatively unaffected by the connection of the upper end of resistor R4 thereto. Therefore it is to be understood that wherever reference is made throughout this specification and the claims to the connection of the input I12 or the voltage divider R3, R4 to the "third stage output" the latter term is to be understood as including not only the output O3 but other circuit points which are equivalent thereto by virtue of a similarity of potential and output impedance.

Since the first stage is operated in the common-emitter connection whereas the second and third stages are effectively operated in the emitter-follower connection, the 3 db cut-off frequency of the first stage will tend to be much lower than that of the succeeding stages. Therefore the type of transistor selected for the first stage must have unusually good high frequency characteristics in order to obviate excessive phase shift and the resultant feedback instability. Generally those transistor types having the required frequency characteristics within a suitable cost range have lower collector-emitter breakdown voltage ratings than the transistor types which may be suitable for the second drive stage where the frequency specification is not as demanding. Furthermore, power transistors which may be suitable for the third power output stage generally have the highest breakdown ratings. Therefore, in most design situations "clipping" will occur in the first stage if a single transistor is used therein so as to be subjected to the entire voltage between the output O3 and ground.

The single-transistor first stage will thus limit the maximum signal amplitude and thereby limit the maximum power capability of the entire amplifier. By utilizing the plural-transistor series-connected first stage as disclosed in the embodiment of FIG. 1 the total voltage is divided approximately equally among the two or more first stage transistors thereby permitting the first stage to swing with a maximum amplitude which is an integral multiple of the maximum amplitude capability of a single-transistor first stage, depending upon the number of transistors connected in series. Although the embodiment of FIG. 1 discloses only two series-connected transistors in the first stage for purposes of simplicity in illustration, it will be understood that any number greater than two may be employed with almost equal facility and requiring only an extra resistor in the voltage divider for each additional transistor. The number of such transistors is limited only by cost limitations.

Since a transistor type having, for example, twice the voltage breakdown rating of another type, generally costs many times more than twice the cost of the latter, it will be seen that a substantial economy may be effected by utilizing a plurality of inexpensive transistors in place of a single expensive transistor. Even where cost considerations permit the designer to utilize the more expensive transistors, a single one of the latter still is likely to have a voltage breakdown rating too low to permit the amplifier to put out the required amount of power. Therefore, although the first stage is not a power stage, the improvement therein as disclosed in the embodiment of FIG. 1 vitally effects the power output performance of the amplifier as a whole, and also provides a means of obtaining substantial savings in transistor costs.

In addition to doubling or otherwise multiplying the effective breakdown voltage rating of the stage as a whole, the series-connected plural-transistor arrangement of the first stage provides still another advantage. It will be noted that the maximum negative swing of output O13 toward the negative supply terminal B− is limited by the voltage drop across load resistor R6 produced by the current flowing out of the base of transistor T22 and then up through resistor R6 to the negative supply terminal B−. Since for a given drive requirement this base current is fixed by the transistor parameters, the minimum voltage across resistor R6 and hence the peak voltage of output O13 is limited by the resistance value of resistor R6. By reducing resistor R6 output O13 can swing closer to the negative supply terminal B− and hence can have a greater maximum amplitude in that direction.

However, a reduction of resistor R6 would require a greater quiescent collector current through the first stage in order to maintain the required quiescent voltage drop between the negative supply terminal B− and output O3 which must be biased approximately midway between the power supply terminals for minimum distortion. This increased collector current in the first stage proportionately increases the power dissipation therein so that if a single transistor were employed in the first stage as was heretofore the case in the prior art, the maximum power dissipation rating of said transistor would be exceeded.

By arranging the first stage in the form of a series-connected plurality of transistors, the latter share approximately equally not only the output voltage but also the power dissipation due to the first stage collector current. Therefore, by utilizing the plural-transistor first stage of FIG. 1, the collector current may be increased and the load resistor R6 correspondingly decreased without exceeding the power dissipation rating of the transistors taken individually. This permissible reduction of load resistor R6 enables output O13 to swing closer toward the negative supply terminal B− for a given base current of transistor T22 and thus permits a greater maximum amplitude for the swing of the first stage and therefore a greater maximum signal amplitude and power output for the amplifier as a whole.

When utilizing the plural-transistor first stage of FIG. 1 so as to prevent initial clipping in the first stage, the second or drive stage is then the stage most likely to commence clipping as the power output is increased. If more power is desired than can be obtained in view of the breakdown limitations imposed by the use of a single transistor in each half of the second stage, then the principle of voltage-sharing may be applied with equally beneficial results to the second stage in the manner disclosed in the embodiment of FIG. 2. In this latter modification, many of the elements are identical to those of the embodiment of FIG. 1 and have applied thereto the same reference designations suffixed by the small letter "*a*."

More specifically, the first stage of the embodiment of FIG. 2 is identical with that of the embodiment of FIG. 1 except that there are two series-connected load resistors R6*a* and R7*a* in place of the single load resistor R6 so as to provide two first stage outputs O13*a*, O14*a* instead of the output O13. Also the connection between the collector of the lower transistor T11*a* and the emitter of the upper transistors T12*a* is tapped to provide still another output O11*a* for the first stage.

The lower half of the second stage comprises two series-connected NPN transistors T21*a*, T22*a* with the emitter of the lower transistor T21*a* connected to the collector of the upper transistor T22*a*. The collector of lower transistor T21*a* is connected by a load resistor R8*a* to ground and the emitter of upper transistor T22*a* is connected by a bias resistor R9*a* to the output O3*a* of the third stage.

The upper half of the second stage comprises two PNP series-connected transistors T23*a*, T24*a* with the collector of the lower transistor T23*a* connected to the emitter of the upper transistor T24*a*. The collector of the latter is in turn connected to the negative supply terminal B− and the emitter of lower transistor T23*a* is connected to the upper end of load resistor R10*a* having its lower end connected to the output O3*a* of the third stage. The four bases of these second stage transistors constitute four inputs I21*a*, I22*a*, I23*a*, I24*a* of the second stage and the two outputs O21*a*, O22*a* thereof are respectively located at the collector of transistor T21*a* and the emitter of transistor T23*a*. These outputs are direct-coupled to the respective base inputs I21*a*, I23*a* of the two power output transistors T31*a*, T32*a* of the third stage, in the same manner as described above with respect to the embodiment of FIG. 1.

The four outputs O11*a*, O12*a*, O13*a*, O14*a* of the first stages are preferably direct-coupled to the respective four inputs I21*a*, I22*a*, I23*a*, I24*a* of the second stage. As a result of the voltage divider arrangement R3*a*, R4*a* connected to the third stage output O3*a*, the emitter of transistor T12*a*, and hence the output O11*a* of the first stage, is maintained at a potential approximately midway between that of the output O3*a* and ground. As a result, the base and emitter of the lowermost second stage transistor T21*a* will be maintained at this potential midpoint so that transistors T21*a* and T22*a* will share approximately equally both the quiescent voltage and the signal swing voltage of output O3*a*. Also, resistors R6*a* and R7*a* are approximately equal so that both the quiescent and dynamic voltage between the negative supply terminal B− and output O3*a* will be shared approximately equally by transistors T23*a* and T24*a* in the upper half of the second stage.

In addition to the elimination of clipping caused by voltage swings in excess of the breakdown voltage ratings, the plural-transistor arrangement of the second stage as disclosed in FIG. 2 provides a further advantage with respect to the power dissipated by each of the second stage transistors. That is, each transistor is required to dissipate only its proportionate share of the total half-stage power dissipation which it would otherwise be required to dissipate in a conventional drive stage consisting of only one PNP transistor and one NPN transistor. As a result, transistor types which are less expensive or which have other desirable characteristics may be utilized in the second stage whereas their power dissipation ratings might be exceeded if they were employed in a conventional circuit lacking other transistors to share the dissipated power.

It is to be understood that although in the specific embodiment disclosed in FIG. 2 for purposes of illustration, each half of the second stage comprises a pair of series-connected transistors, there may be a greater or lesser number in each half as may be desirable in particular design situations. For example, germanium PNP transistors having collector-emitter voltage breakdown ratings in the range of 40 volts and suitable for the upper half of the second stage are currently available at moderate prices, whereas NPN types having equal characteristics are presently limited to extremely expensive silicon transistors. Therefore, instead of utilizing a pair of extremely expensive NPN transistors in the lower half of the second stage, one might utilize four inexpensive germanium transistors each having a voltage breakdown rating of approximately 20 volts, while in the upper half of the second stage there would be merely two PNP germanium transistors each having a voltage breakdown rating of approximately 40 volts, so that each half of the stage could withstand approximately the same voltage swing without resort to exhorbitant transistor costs.

In the event that four transistors are utilized in the lower half of the second stage and only two transistors in the first stage, the bases of the two extra transistors in the lower half of the second stage may be driven by voltage dividers in the manner disclosed in the embodiment of FIG. 4 to be described in detail below. Alternatively, all four of the lower half second stage transistors may be driven by voltage dividers, as will become apparent from the description of the latter embodiment. Similarly, the upper transistor T24*a* of the second stage may be driven by a voltage divider of the type disclosed in FIG. 4. In this event, the first stage collector load resistor R6*a* would extend from diode D*a* to the negative supply terminal B−.

Having obviated the breakdown voltage and power dissipation limitations of both the first voltage amplification stage and the second drive stage, there remains now only to provide the same improvement in the third power output stage, and this is achieved in the preferred embodiment disclosed in FIG. 3. The first stage is substantially similar to the first stage of the embodiment of FIG. 1 and hence need not be further described except to note that the reference designations of the corresponding elements of FIG. 3 are suffixed by the reference letter "*b*." The second stage of FIG. 3 is substantially similar to the second stage of the embodiment of FIG. 2 except that in the former two additional outputs O22*b* and O24*b* are provided at the collector of the second transistor T22*b* and the emitter of the fourth transistor T24*b*. The second stage of the embodiment of FIG. 3 is thus provided with four outputs which are preferably direct-coupled to the respective four inputs 131*b*, 132*b*, 133*b*, 134*b* at the respective bases of the four power transistors T31*b*, T32*b*, T33*b*, T34*b*.

Each of the latter are disclosed for purposes of illustration as being of the PNP type and are arranged in series-connected pairs in each half of the third stage. Each pair comprises a lower transistor T31*b* or T33*b* having its collector connected to the emitter of an upper transistor T32*b* or T34*b*, respectively. A bias resistor R11*b* connects the emitter of transistor T31*b* to ground and another bias resistor R12*b* connects the emitter of transistor T33*b* to the output O3*b*. Also connected to the latter is the collector of the second transistor T32*b*, and the collector of the fourth transistor T34*b* is connected to the negative supply terminal B−.

Since the base of output transistor T32*b* is maintained by drive stage output O22*b* at a potential midway between the respective potentials of ground B+ and output O3*b*, the two series-connected output transistors T31*b*, T32*b* in the lower half of the power stage share approximately equally both the voltage and power dissipation thereof. Similarly, the base of output transistor T34*b* is maintained by drive stage output O24*b* at a potential midway between the respective potentials of the other A.C. ground B− and output O3*b* to provide voltage and power sharing by the upper half-stage output transistors T33*b*, T34*b*.

The third stage arrangement of FIG. 3 is particularly useful where the designer may desire to utilize a particular output transistor type because of some superior characteristic such as high cut-off frequency, but the selected type lacks the required collector-emitter breakdown voltage rating and/or maximum power dissipation rating for the specified amplifier power output. Such a transistor type, for example, would be the 2N1905 which has a beta cutoff frequency of 75 kc., unusually high for an inexpensive germanium power type, but which has a relatively low collector-emitter breakdown voltage rating of 40 volts and a moderate maximum power dissipation rating of 50 watts at a mounting-flange temperature of 25° C. Therefore, only two 2N1905 transistors in said prior art circuit will provide an amplifier with excellent quality but inadequate power output whereas utilizing four units of this type in the third stage as disclosed in FIG. 3 will provide the same quality at approximately four times the power output.

Referring now to FIG. 4, there are disclosed the first and second stages of a preferred modified form of the invention. The first stage comprising transistor T11*c* is substantially similar to that of the embodiment of FIG. 1 except for the use of a single transistor and the corresponding elements are given the same reference designations suffixed by the small letter "*c*." The second stage comprises the two NPN transistors T21*c*, T22*c* arranged in series with the emitter of the lower transistor T21*c* connected to the collector of the upper transistor T22*c*. The emitter of the latter is connected through bias resistor R9*c* to the output O3*c* of the third stage (not shown) and the collector of T21*c* is connected to load resistor R8*c* which is connected to ground.

The upper half of the second stage comprises a pair of PNP transistors T23*c*, T24*c* arranged in series with the collector of lower transistor T23*c* connected to the emitter of upper transistor T24*c*. The collector of the latter is connected to the negative supply terminal (not shown) and the emitter of T23*c* is connected to load resistor R10*c* which is connected to the output O3*c* of the third stage. The second stage of FIG. 4 has two outputs: one at the collector of the first transistor T21*c* and the other at the emitter of the third transistor T23*c*.

As thus far described the second stage of FIG. 4 is identical to that of FIG. 2. However the drive arrangement is different. The bases of transistors T22*c* and T23*c* are direct-coupled to the first stage outputs O12*c* and O13*c* respectively in the same manner as in FIG. 2, whereas the other transistors T21*c* and T24*c* are driven by voltage dividers energized by the third stage output O3*c* in the following manner.

A first resistor R13 is connected between ground and the base of T21*c* and a second resistor R14 is connected between said base and the third stage output O3*c*. If the resistors are approximately equal, the base of T21*c* will be maintained at approximately half the potential of O3*c* so that T21*c* and T22*c* will share aproximately equally the voltage, both quiescent and signal, of the output O3*c*.

In a similar manner, T24*c* is driven by a voltage divider comprising resistors R15 and R16 connected in series between the negative supply terminal and the third stage output O3*c* with the base of T24*c* connected to the junction of the resistors. Transistors T23*c* and T24*c* will thus share approximately equally the voltage between the negative terminal and O3*c*.

The number of transistors in each half of the second stage of FIG. 4 may be varied. For example, the upper half may have only a single transistor as in FIG. 1 whereas the lower half may comprise two or even more transistors.

Of course, the first stage of the embodiment of FIG. 4 may have two or more series-connected transistors, if desired, with outputs at only the collector of the uppermost transistor and the upper end of diode resistance element D*c*. However, the second stage drive arrangement of FIG. 4 would be particularly useful where there is required a plural-transistor arrangement for one or both halves of the second stage and only a single transistor in the first stage.

It is important to note that the voltage dividers R13, R14 and R15, R16 do not load down the second stage. This is because they are energized by the output O3*c* of the third stage which is a power stage having an extremely low output impedance compared to the drive current requirements of T21*c* and T24*c*. If the second stage were not succeeded by the third stage and if the output of the second stage were at the point designated O3*c*, then the drive arrangement of FIG. 4 would be markedly inferior to the drive arrangement of FIG. 2 because the second stage would then be unduly loaded down by the voltage dividers.

For this reason the next modification of FIG. 5 is unlikely to have any important utility but is included for completeness and for a better understanding of the above discussion of the embodiment of FIG. 4. In FIG. 5 there are shown only the second and third stages. The second stage comprising complementary driver transistors T21*d* and T23*d* is identical to the second stage of the embodiment of FIG. 1. The third stage comprises four transistors T31*d*, T32*d*, T33*d*, T34*d* and is identical to the third stage of the embodiment of FIG. 3 except that the drive arrangement is different from that of the latter. The bases of T31*d* and T33*d* are direct-coupled to the collector of T21*d* and the emitter of T23*d*, respectively. The bases of T32*d* and T34*d* are driven by voltage dividers consisting of the resistor pair R17, R18 and the resistor pair R19, R20, each pair extending in series-connected fashion from the output O3*d* to a respective one of the supply terminals which are at A.C. ground potential.

The third stage drive arrangement of FIG. 5, although apparently similar to the second stage drive arrangement of FIG. 4, is actually much inferior to the latter. Because the voltage dividers R17, R18 and R19, R20 are energized by the output of the very same stage which they are to drive, they are usually either of too high an impedance to pass the required amount of signal drive current to the bases of T32*d* and T34*d* or they are of too low an impedance to avoid excessive loading down of the third stage output O3*d*. Any attempt at compromising the impedance value of the voltage dividers R17, R18 and R19, R20 merely makes them somewhat inadequate in both respects since the two requirements are usually incompatible.

In FIG. 4, on the other hand, there is interposed an additional stage of current amplification and the bases of T21*c* and T24*c* require much less signal drive current than the bases of T32*d* and T34*d* for a given amplifier output power. Therefore the resistors R13, R14, R15, R16 may be sufficiently low in value to pass the required drive current without being so small as to unduly load down the third stage output O3*c*. It is therefore of critical importance to energize the voltage dividers from the output of a stage succeeding the stage to be driven.

It is to be understood that each of the inventive embodiments discussed above is merely illustrative and that numerous modifications will readily occur to those skilled in the art. For example, the amplifier is preferably to be provided with negative feedback from the amplifier output to the base or emitter of the lowermost transistor of the first stage. However, for purposes of clarity in illustration this type of feedback, as well as many other feature and variation, have been omitted from the drawings and specification.

I claim:

1. A transistor power amplifier comprising a push-pull power output stage including a ground terminal and an output terminal having a relatively low output impedance, a stage preceding said output stage and including at least two transistors each having a base, one of said transistors having an emitter and the other of said transistors having a collector, said transistors being connected in series with the emitter of said one transistor connected to the collector of the other transistor and having a total voltage thereacross varying coextensively with said output terminal, means for connecting a signal source to one of said bases, means transmitting the output signal of said preceding stage to said output stage to drive the latter, and circuit means connecting said output terminal to the other base to drive the latter so as to provide approximately equal voltage swings of said transistors in response to a signal source applied to said one base.

2. An amplifier as recited in claim 1 wherein said circuit means comprises a voltage divider to maintain the voltage of said other base at a predetermined ratio with respect to the voltage of said power stage output terminal.

3. An amplifier as recited in claim 2 wherein said voltage divider comprises a first resistance means connected between said power stage output terminal and said other base, and a second resistance means connected between said other base and said ground terminal.

4. In a transistor power amplifier of the type having a first stage of voltage amplification coupled to a second stage of complementary drivers coupled to a third stage of push-pull single-ended power output including an output terminal and a ground terminal, the improvement wherein said first stage comprises at least two transistors connected in series and having at least two inputs, means for connecting a signal source to one of said inputs, and circuit means connecting said power stage output terminal to the other input to provide approximately equal voltage swings of said first stage transistors in response to a signal applied to said one input.

5. An amplifier as recited in claim 4 wherein said circuit means comprises a voltage divider to maintain the voltage of said other input at a predetermined ratio with respect to the voltage of said power stage output terminal.

6. An amplifier as recited in claim 5 wherein said voltage divider comprises a first resistance means connected between said power stage output terminal and said other input and a second resistance means connected between said other input and said ground terminal.

7. A transistor amplifier comprising a direct current supply having at least two terminals, a grounded-emitter stage, a push-pull drive stage connected in cascade to said grounded-emitter stage, and a push-pull output stage connected in cascade to said drive stage, at least one of said push-pull stages having at least two transistors connected in series between said supply terminals and the other push-pull stage having at least four transistors connected in series between said supply terminals, at least one of said push-pull stages comprising mutually complementary transistors of both NPN and PNP types.

8. An amplifier as recited in claim 7 wherein said grounded-emitted stage comprises at least two transistors connected in series, means for transmitting an input signal, one of said grounded-emitter stage transistors having a base connected to said input signal transmitting means, said output stage having an output terminal, the other of said grounded-emitter stage transistors having a base, and means connecting said output terminal to said last-recited base to drive the latter.

9. An amplifier as recited in claim 8 wherein said connecting means comprises a voltage divider including a plurality of resistors connected in series between said output terminal and one of said supply terminals.

10. A transistor power amplifier comprising a first common-emitter voltage-amplification stage direct-coupled in cascade to a second push-pull complementary-symmetry drive stage direct-coupled in cascade to a third push-pull single-ended half-bridge power output stage, a power supply comprising at least two terminals, said first stage comprising at least two transistors each having a base, an emitter and a collector, a bias resistor connecting the emitter of a first of said transistors to one of said supply terminals, the second transistor emitter being connected to the first transistor collector, a plurality of series-connected resistance elements connected between said second transistor collector and the other supply terminal, means connecting a signal source to said first transistor base to drive the latter, and circuit means connecting the output of one of said stages to said second transistor base to drive the latter so as to provide approximately equal voltage swings of said transistors in response to a signal applied to said first transistor base.

11. An amplifier as recited in claim 10 wherein said circuit means comprises a voltage divider including at least two resistors connected in series between said output and said one supply terminal, said second transistor base being connected to the junction of said series-connected resistors.

12. An amplifier as recited in claim 10 wherein said second stage comprises a first half-stage having at least two NPN transistors and a second half-stage having at least two PNP transistors, said NPN transistors being mutually series-connected with the emitter of one connected to the collector of the other, said PNP transistors being mutually series-connected with the emitter of one being connected to the collector of the other, the collector of one transistor of each of said half-stages being connected to a respective one of said supply terminals.

13. In a transistor power amplifier of the type having a first stage of voltage amplification direct-coupled to a second stage of complementary-symmetry drivers direct-coupled to a third stage of push-pull single-ended power output including an output terminal direct-coupled thereto, the improvement wherein at least one of said stages comprises at least two transistors connected in series and having at least two base inputs, means for connecting a signal source to one of said inputs, and feedback means connecting said output terminal to the other input to provide approximately equal voltage swings of said transistors in response to a signal applied to said one input.

14. An amplifier as recited in claim 13 wherein said third stage comprises at least four transistors mutually connected in series and having at least four inputs, means connecting at least two of said third stage inputs to said second stage, and feedback means connecting said power stage output terminal to the other inputs of said third stage to provide approximately equal voltage swings of the transistors thereof in response to a signal applied to said first stage.

15. An amplifier as recited in claim 14 wherein said feedback means comprises a voltage divider.

16. An amplifier as recited in claim 15 and comprising a power supply having a pair of terminals and wherein each of said voltage dividers comprises a first resistance means connected between said output terminal and said respective input, and a second resistance means connected between said respective input and a respective one of said power supply terminals.

17. An amplifier as recited in claim 13 wherein said second stage comprises at least four transistors mutually connected in series and having a least four base inputs, means connecting at least two of said second stage inputs to said first stage, and feedback means connecting said power stage output terminal to the other inputs of said second stage.

18. An amplifier as recited in claim 17 and comprising a power supply having a pair of terminals and wherein said last-recited feedback means comprises a plurality of voltage dividers each including two resistive components connected in series and extending between said output terminal and one of said power supply terminals.

19. An amplifier as recited in claim 17 wherein said third stage comprises at least four transistors mutually connected in series and having at least four base inputs, each of said second stage transistors having an emitter and a collector, means direct-coupling two of said third stage inputs respectively to each emitter of a first pair of said second stage transistors, and means direct-coupling two other third stage inputs respectively to each collector of a second pair of said second stage transistors.

20. An amplifier as recited in claim 19 wherein said first pair of second stage transistors are of a polarity type opposite that of said second pair of second stage transistors.

21. An amplifier comprising a first stage including a network having two active devices connected in series and each having an input,
first circuit means for applying a signal to one of said inputs,
a second stage including an output,
a source of direct-current potential,
said series-connected network having one end connected to said potential source and its opposite end varying in potential coextensively with said output,
second circuit means connecting said second stage in cascade relation to said first stage, and
feedback means extending from said output to the other of said inputs to cause said active devices to be driven in phase so as to share the total voltage across both devices as said total voltage swings coextensively with the voltage swing of said second stage output.

22. An amplifier as recited in claim 21 wherein said first stage includes two half-stages acting in push-pull relation,
one of said half-stages comprising said two active devices.

23. An amplifier as recited in claim 21 wherein each of said active devices comprises a transistor having a base electrode constituting a respective one of said inputs,
one of said transistors having a collector and the other of said transistors having an emitter connected to said collector.

24. An amplifier as recited in claim 21 wherein said feedback means includes voltage dividing impedance means extending between said potential source and said output, and
a direct-coupling connection between said voltage dividing means and said other input.

25. An amplifier as recited in claim 21 and comprising a second direct-current potential source of different voltage than said first source,
said first stage comprising a pair of transistors each having a collector and an emitter,
a load impedance extending from one of said sources to the collector of one transistor,
the emitter of said one transistor being connected to the collector of the other transistor,
the emitter of said other transistor being connected to the other of said sources.

26. A transistor power amplifier comprising a drive stage including two half-stages operating in push-pull relation,
a single-ended output stage having an output and including two half-stages operating in push-pull relation and driven by said drive half-stages respectively,
at least one of said drive half-stages comprising two transistors connected in series and each having a base,
first circuit means for applying a signal to one of said bases, and
other circuit means extending from said output to the other of said bases to drive the corresponding transistor in phase with the other transistor so as to cause the transistors to share the total voltage swing of said output.

27. A transistor power amplifier as recited in claim 26 wherein said other circuit means comprises an impedance network to divide the voltage of said output, and
a feedback connection between said impedance network and said other base to apply thereto a predetermined proportion of said output voltage.

28. A transistor power amplifier as recited in claim 27 wherein said feedback connection comprises a direct-current coupling between said impedance network and said other base.

29. In a transistor power amplifier of the type having a first stage of voltage amplification direct-coupled to a second stage of complementary-symmetry drivers connected to a push-pull single-ended power output stage including an output terminal, and a power supply, the improvement wherein said output stage comprises two half-stages operating in push-pull relation,
at least one of said half-stages including at least two transistors connected in series between said power supply and said output terminal,
each of said transistors having a base input,
circuit means transmitting an output signal from said drive stage to one of said base inputs, and
feedback means connecting said output terminal to the other input to provide approximately equal voltage swings of said transistors in response to said signal.

(References on following page)

References Cited by the Examiner

UNITED STATES PATENTS

| | | | |
|---|---|---|---|
| 2,423,362 | 7/1947 | Banker | 330—70 |

References Cited by the Applicant

UNITED STATES PATENTS

| | | |
|---|---|---|
| 2,896,029 | 7/1959 | Lin. |
| 2,926,307 | 2/1960 | Ehret. |
| 2,981,895 | 4/1961 | Koch. |
| 2,999,984 | 9/1961 | Beck. |
| 3,018,446 | 1/1962 | Knudson. |
| 3,024,422 | 3/1962 | Jansson. |
| 3,233,184 | 2/1966 | Wheatley. |

KATHLEEN H. CLAFFY, *Primary Examiner.*

ROBERT H. ROSE, *Examiner.*

S. J. BOR, *Assistant Examiner.*